United States Patent
Yoon et al.

(10) Patent No.: US 10,680,122 B2
(45) Date of Patent: Jun. 9, 2020

(54) SOLAR CELL AND METHOD FOR MANUFACTURING THE SAME

(75) Inventors: Philwon Yoon, Seoul (KR); Changseo Park, Seoul (KR); Yoonsil Jin, Seoul (KR); Jinsung Kim, Seoul (KR); Goohwan Shim, Seoul (KR); Youngho Choe, Seoul (KR); Jaewon Chang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/987,853

(22) Filed: Jan. 10, 2011

(65) Prior Publication Data
US 2011/0100459 A1    May 5, 2011

(30) Foreign Application Priority Data
Sep. 27, 2010    (KR) .................. 10-2010-0093107

(51) Int. Cl.
| | | |
|---|---|---|
| H01L 31/068 | (2012.01) | |
| H01L 31/0216 | (2014.01) | |
| H01L 31/0224 | (2006.01) | |
| H01L 31/0236 | (2006.01) | |

(52) U.S. Cl.
CPC .. H01L 31/02168 (2013.01); H01L 31/02363 (2013.01); H01L 31/022425 (2013.01); H01L 31/068 (2013.01); *Y02E 10/547* (2013.01)

(58) Field of Classification Search
USPC ......................................... 136/259
See application file for complete search history.

(56) References Cited

U.S. PATENT DOCUMENTS

| | | | | |
|---|---|---|---|---|
| 4,577,393 A | * | 3/1986 | Schmidt | 438/72 |
| 5,356,488 A | * | 10/1994 | Hezel | 136/256 |
| 5,510,271 A | * | 4/1996 | Rohatgi | H01L 31/02168 |
| | | | | 136/261 |
| 5,665,175 A | | 9/1997 | Safir | |
| 5,935,344 A | | 8/1999 | Endo et al. | |
| 2009/0014063 A1 | * | 1/2009 | Stangl et al. | 136/256 |
| 2009/0283145 A1 | * | 11/2009 | Kim et al. | 136/261 |
| 2010/0012185 A1 | | 1/2010 | Schmid et al. | |
| 2010/0126572 A1 | * | 5/2010 | Kizilyalli et al. | 136/255 |
| 2010/0154883 A1 | | 6/2010 | Komatsu et al. | |
| 2010/0275984 A1 | * | 11/2010 | Kaes et al. | 136/255 |

FOREIGN PATENT DOCUMENTS

| | | |
|---|---|---|
| DE | 10 2009 005 168 A1 | 7/2010 |
| JP | H05315628 A | 11/1993 |
| KR | 20050113177 A | 12/2005 |
| KR | 20090091562 A | 8/2009 |
| WO | WO 2008/045511 A2 | 4/2008 |

\* cited by examiner

*Primary Examiner* — Dustin Q Dam
(74) *Attorney, Agent, or Firm* — Dentons US LLP

(57) ABSTRACT

A solar cell and a method for manufacturing the same are disclosed. The solar cell includes a substrate, an emitter layer at a front surface of the substrate, a first anti-reflection layer on the emitter layer, a back surface field layer at a back surface of the substrate, and a second anti-reflection layer on the back surface field layer. The first anti-reflection layer and the second anti-reflection layer overlap may each other.

13 Claims, 4 Drawing Sheets ature and/or element. Additionally, a layer may also be used herein.
SOLAR CELL AND METHOD FOR MANUFACTURING THE SAME This application claims priority to and the benefit of Korean Patent Application No. 10-2010-0093107, filed in the Korean Intellectual Property Office on Sep. 27, 2010, the entire contents of which are incorporated by reference for all purposes as if set forth herein.

BACKGROUND

Field of the Invention

Exemplary embodiments of the invention relate to a solar cell and a method for manufacturing the same.

Description of the Related Art

The solar power generation of converting light energy into electric energy using a photoelectric transformation effect has been widely used as a method for obtaining eco-friendly energy. A solar power generation system using a plurality of solar cell panels has been installed in houses due to improvement of photoelectric transformation efficiency of solar cells.

The solar cell generally includes a substrate and an emitter layer that forms a p-n junction along with the substrate, thereby generating an electric current from light incident on the solar cell through one surface of the substrate. Further, an anti-reflection layer is formed on a light receiving surface of the substrate, so as to reduce a reflectance of light incident on the substrate and increase a light transmittance of a predetermined wavelength band. Hence, the photoelectric transformation efficiency of the solar cell increases.

Because light is generally incident on the solar cell through only one surface of the substrate, current transformation efficiency of the solar cell is low. Accordingly, a double-sided light receiving solar cell, in which light is incident on the solar cell through both surfaces of the substrate, has been recently developed.

SUMMARY

In one aspect, a solar cell may include a substrate, an emitter layer at a front surface of the substrate, a first anti-reflection layer on the emitter layer, a back surface field layer at a back surface of the substrate, and a second anti-reflection layer on the back surface field layer. The first anti-reflection layer and the second anti-reflection layer may overlap each other.

The second anti-reflection layer may be at the back surface, a side surface and an edge of the front surface of the substrate. The second anti-reflection layer may extend a distance over the edge of the front surface of the substrate of equal to or less than about 1 mm.

The back surface field layer may be at the back surface, the side surface and the edge of the front surface of the substrate. The second anti-reflection layer may extend a distance over the edge of the front surface of the substrate at least as much as a distance the back surface field layer extends over the edge of the front surface of the substrate.

The edge of the front surface of the substrate may be covered by the emitter layer or may be not covered by the emitter layer. The back surface field layer may extend over the edge of the front surface of the substrate less than a width of the edge of the front surface of the substrate that is not covered by the emitter layer. The second anti-reflection layer may extend over the edge of the front surface of the substrate about equal to a width of the edge of the front surface of the substrate that is not covered by the emitter layer.

The first anti-reflection layer may be on the second anti-reflection layer. The first anti-reflection layer may be at the front surface, the side surface and an edge of the back surface of the substrate. The first anti-reflection layer may extend a distance over the edge of the back surface of the substrate of equal to or less than about 1 mm.

The solar cell may include a plurality of first electrodes electrically connected to the emitter layer and may include a plurality of second electrodes electrically connected to the back surface field layer.

One or both of the front surface and the back surface of the substrate may be textured to form a textured surface having a plurality of uneven portions.

The first anti-reflection layer may include: an upper layer; and a lower layer between the emitter layer and the upper layer. The lower layer may include an aluminum oxide layer or a thermal oxide layer. The upper layer may include a silicon nitride layer.

The second anti-reflection layer may include a silicon nitride layer.

A method for manufacturing a solar cell may include: forming a back surface field layer at a back surface, a side surface, and a front surface of a substrate; forming a second anti-reflection layer on the back surface field layer at the back surface, the side surface and an edge of the front surface of the substrate, wherein a portion of the back surface field layer at the front surface of the substrate is uncovered; removing the uncovered portion of the back surface field layer; forming an emitter layer at the front surface of the substrate where the back surface field layer was removed; and forming a first anti-reflection layer on the emitter layer.

The first anti-reflection layer may be formed on the second anti-reflection layer. The first anti-reflection layer may be formed at the front surface, the side surface and an edge of the back surface of the substrate.

Before the emitter layer and the back surface field layer are formed, one or both of the front surface and the back surface of the substrate may be textured to form a textured surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
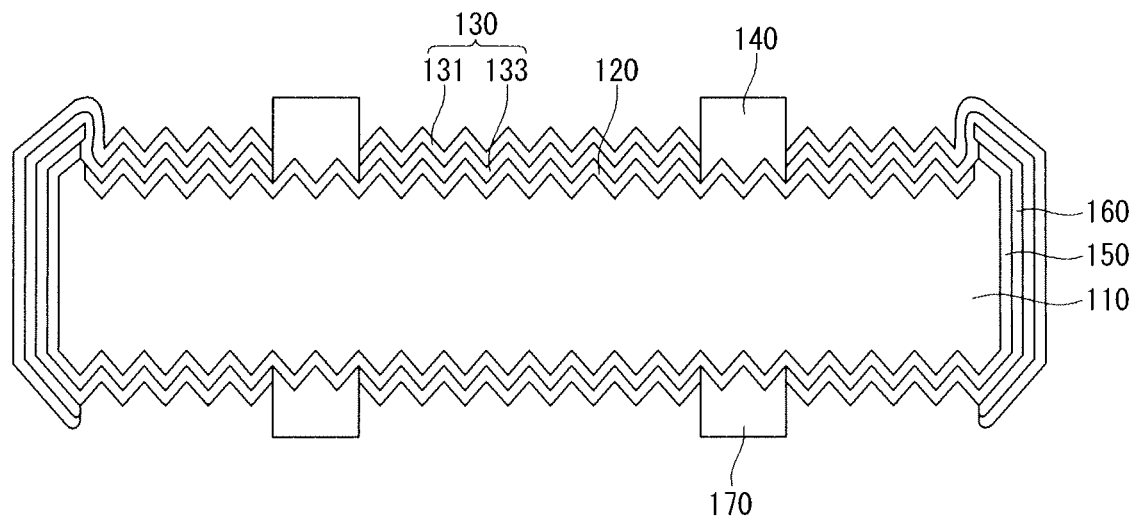
FIG. 1 is a schematic cross-sectional view of an exemplary solar cell.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., may be exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, it will be understood that when an element such as a layer, film, region, or substrate is referred to as being "on" another element, it can be on an entire surface of the other element or it can be on only a portion of the entire surface of the other element. In contrast, when an element is referred to as being "entirely on" another element, it is on the entire surface of the other element and not on only a portion of the entire surface of the other element.

Figure 2:
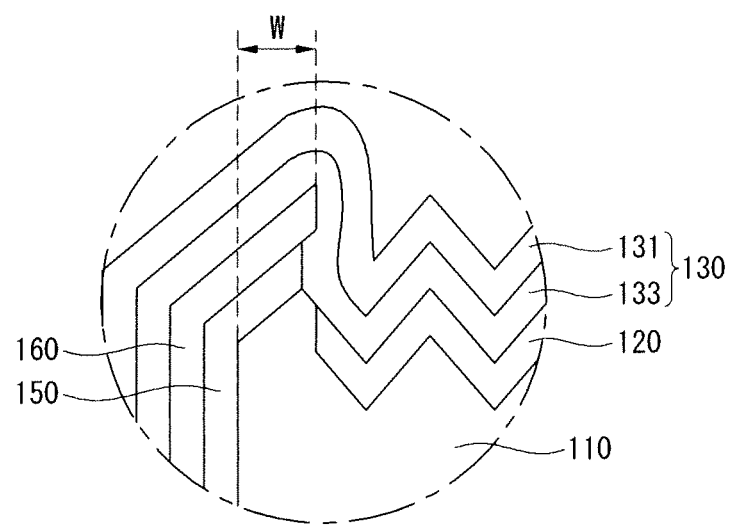
FIG. 2 is an enlarged cross-sectional view of a main part of the solar cell shown in FIG. 1.

FIG. 1 is a schematic cross-sectional view of an exemplary solar cell. FIG. 2 is an enlarged cross-sectional view of a main part of the solar cell shown in FIG. 1. FIGS. 3 to 9 are cross-sectional views illustrating an exemplary method for manufacturing the solar cell shown in FIG. 1.

The solar cell may include a substrate 110, an emitter layer 120, a first anti-reflection layer 130, a plurality of first electrodes 140, a back surface field (BSF) layer 150, a second anti-reflection layer 160 and a plurality of second electrodes 170. The emitter layer 120 may be positioned at one surface, for example, a front surface of the substrate 110. The first anti-reflection layer 130 may be positioned on the emitter layer 120. The plurality of first electrodes 140 may be positioned on the emitter layer 120 where the first anti-reflection layer 130 is not positioned. The back surface field (BSF) layer 150 may be positioned at a back surface of the substrate 110. The second anti-reflection layer 160 may be positioned on the back surface field layer 150. The plurality of second electrodes 170 may be positioned on the back surface field layer 150 where the second anti-reflection layer 160 is not positioned.

The substrate 110 may be formed of a silicon wafer of a first conductive type, for example, n-type, though not required. Silicon used in the substrate 110 may be crystalline silicon, such as single crystal silicon and polycrystalline silicon, or amorphous silicon. When the substrate 110 is of the n-type, the substrate 110 may contain impurities of a group V element such as phosphorus (P), arsenic (As), and antimony (Sb). The substrate 110 may have resistivity of about 1 $\Omega \cdot cm^2$ to about 10 $\Omega \cdot cm^2$.

Alternatively, the substrate 110 may be of a p-type and/or may be formed of other semiconductor materials other than silicon. When the substrate 110 is of the p-type, the substrate 110 may contain impurities of a group III element such as boron (B), gallium (Ga), and indium (In).

The surface of the substrate 110 may be uniformly textured to form a textured surface corresponding to an uneven surface or having uneven characteristics. More specifically, the substrate 110 may have a first textured surface 111 corresponding to the front surface where the emitter layer 120 is positioned and a second textured surface 113 corresponding to the back surface where the back surface field layer 150 is positioned.

The back surface field layer 150 may be formed at the entire back surface, the entire side surface, and a portion of the front surface (for example, an edge of the front surface) of the substrate 110.

The back surface field layer 150 may be a region (for example, n+-type region) that is more heavily doped than other portions the substrate 110. The back surface field layer may be doped with impurities of the same conductive type as the substrate 110. The back surface field layer 150 may have a surface resistivity of about 50 $\Omega$/sq to about 150 $\Omega$/sq.

The movement of holes to the back surface of the substrate 110 may be prevented or reduced by a potential barrier resulting from a difference between impurity concentrations of the substrate 110 and the back surface field layer 150. Hence, a recombination and/or a disappearance of electrons and holes around the back surface of the substrate 110 may be prevented or reduced.

Further, when the back surface field layer 150 is formed at the entire side surface and the edge of the front surface as well as the entire back surface of the substrate 110, carriers generated by light may be efficiently collected in an internal electric field.

The second electrodes 170 may be electrically and physically connected to a portion of the back surface field layer 150, and the second anti-reflection layer 160 may be positioned on the back surface field layer 150 where the second electrodes 170 are not positioned.

The second electrodes 170 may collect carriers (for example, electrons) moving to the substrate 110 and output the carriers to an external device. The second electrodes 170 may be formed of a conductive material. The conductive material may be, for example, aluminum (Al), nickel (Ni), copper (Cu), silver (Ag), tin (Sn), zinc (Zn), indium (In), titanium (Ti), gold (Au), or a combination thereof.

In one exemplary embodiment of the invention, the second electrodes 170 may be formed of Ag or a mixture (AgAl) of Ag and Al. In another exemplary embodiment, the second electrodes 170 may be formed of a plating layer formed by plating a metal material. The plating layer may include a metal seed layer formed of nickel silicide (for example, $Ni_2Si$, NiSi, and $NiSi_2$), a nickel diffusion barrier layer, a copper layer, and a tin layer. Other layered or non-layered structures may be used for the plating layer.

The second anti-reflection layer 160 reduces reflectance of light incident through the back surface of the substrate 110 and may increase selectivity of a predetermined wavelength band, thereby increasing the efficiency of the solar cell. The second anti-reflection layer 160 may be formed on the entire back surface of the substrate 110 except a formation area of the second electrodes 170, the entire side surface, and the edge of the front surface of the substrate 110.

According to the above-described structure of the solar cell, the back surface field layer 150 and the second anti-reflection layer 160 may be formed at the entire side surface and the edge of the front surface of the substrate 110.

In one aspect, a width W of the second anti-reflection layer 160 positioned at the edge of the front surface of the substrate 110 may be equal to or less than about 1 mm.

In another aspect, a width of the back surface field layer 150 positioned at the edge of the front surface of the substrate 110 may be equal to or less than the width W of the second anti-reflection layer 160 positioned at the edge of the front surface of the substrate 110.

In other words, as shown in FIG. 2, an end of the back surface field layer 150 may protrude less than an end of the second anti-reflection layer 160. Alternatively, the end of the back surface field layer 150 and the end of the second anti-reflection layer 160 may be formed on the same line. Thus, the back surface field layer 150 may be electrically insulated from the emitter layer 120.

The second anti-reflection layer 160 may be formed of silicon nitride (SiNx:H) having a refractive index of about 1.9 to about 2.3 and may have a thickness of about 50 nm to about 300 nm.

The emitter layer 120 positioned at the front surface, first textured surface 111, of the substrate 110 may be separated and electrically insulated from the end of the back surface field layer 150 positioned at the edge of the front surface of the substrate 110. In this case, an end of the emitter layer 120 and the end of the second anti-reflection layer 160 may be positioned on the same line.

The emitter layer 120 may be an impurity region of a second conductive type (for example, p-type) opposite the first conductive type (for example, n-type) of the substrate 110 and may form a p-n junction along with the substrate 110.

A plurality of electron-hole pairs produced by light incident on the substrate 110 may be separated into electrons and holes by a built-in potential difference resulting from the p-n junction between the substrate 110 and the emitter layer 120. The separated electrons may move to the n-type semiconductor, and the separated holes may move to the p-type semiconductor. When the substrate 110 is of the n-type and the emitter layer 120 is of the p-type, the separated electrons and the separated holes may move to the substrate 110 and the emitter layer 120, respectively. Accordingly, the electrons may become major carriers in the substrate 110, and the holes may become major carriers in the emitter layer 120.

When the emitter layer 120 is of the p-type, the emitter layer 120 may be formed by doping the substrate 110 with impurities of a group III element such as B, Ga, and In. The emitter layer 120 may have a surface resistivity of about 30 Ω/sq to about 120 Ω/sq.

Alternatively, when the substrate 110 is of the p-type, the emitter layer 120 may be of the n-type. In this case, the separated holes move to the substrate 110, and the separated electrons move to the emitter layer 120. When the emitter layer 120 is of the n-type, the emitter layer 120 may be formed by doping the substrate 110 with impurities of a group V element such as P, As, and Sb.

An end of the first anti-reflection layer 130 on the emitter layer 120 may extend to an edge of the back surface of the substrate 110. The first anti-reflection layer 130 may be positioned at the edge of the back surface of the substrate 110 may have a width equal to or less than about 1 mm in the same manner as the second anti-reflection layer 160.

Accordingly, the back surface field layer 150, the second anti-reflection layer 160, and the first anti-reflection layer 130 may overlap one another at the edges of the front and back surfaces of the substrate 110 as well as at the entire side surface of the substrate 110.

Although it is not shown in detail, the first anti-reflection layer 130 may be formed on the entire surface of the emitter layer 120 except the edge of the front surface of the substrate 110, or may extend to the edge of the front surface of the substrate 110.

The first anti-reflection layer 130 serves as an anti-reflection layer that reduces reflectance of light incident through the front surface of the substrate 110 and may increase selectivity of a predetermined wavelength band to thereby increase the efficiency of the solar cell. In addition, the first anti-reflection layer 130 may serve as a passivation layer.

The first anti-reflection layer 130 may have a double-layered structure including an upper layer 131 and a lower layer 133 between the emitter layer 120 and the upper layer 131.

The upper layer 131 may be formed of silicon nitride (SiNx:H), and the lower layer 133 may be formed of silicon nitride (SiNx:H) and a material, for example, aluminum oxide (AlOx) having a large absorption coefficient or a large bandgap. The lower layer 133 may have a refractive index of about 1.55 to about 1.7 and a thickness equal to or less than about 50 nm, and the upper layer 131 may have a refractive index of about 1.9 to about 2.3 and a thickness of about 50 nm to about 100 nm, so as to minimize the light reflectance in the first anti-reflection layer 130.

The light reflectance in the first anti-reflection layer 130 may be minimized when the first anti-reflection layer 130 has the double-layered structure including the upper layer 131 formed of silicon nitride (SiNx:H) and the lower layer 133 formed of aluminum oxide (AlOx) each of which being within the above refractive index and thickness ranges.

Thermal oxide may be used for the lower layer 133, instead of aluminum oxide (AlOx).

The plurality of first electrodes 140 may be positioned on the emitter layer 120 at the front surface of the substrate 110 and may be electrically and physically connected to the emitter layer 120. The first electrodes 140 may extend substantially parallel to one another in a fixed direction. The first electrodes 140 may have substantially the same width and pitch as the second electrodes 170. The widths of the first electrodes 140 may be less than the widths of the second electrodes 170.

The first electrodes 140 may collect carriers (for example, holes) moving to the emitter layer 120. The first electrodes 140 may be formed of a conductive material, such as aluminum (Al), nickel (Ni), copper (Cu), silver (Ag), tin (Sn), zinc (Zn), indium (In), titanium (Ti), gold (Au), or a combination thereof. The first electrodes 140 may be formed in the same manner as the second electrodes 170. For example, the first electrodes 140 may be formed of Ag or a mixture (AgAl) of Ag and Al.

Alternatively, the first electrodes 140 may be formed of a plating layer.

The solar cell having the above-described structure may serve as a double-sided light receiving solar cell, and an operation of the solar cell is described below.

When light irradiated onto the solar cell is incident on the substrate 110 through the emitter layer 120 and/or the back surface field layer 150, a plurality of electron-hole pairs are generated in the substrate 110 by the light energy. In this case, because the front surface and the back surface of the substrate 110 may be the first textured surface 111 and the second textured surface 113, respectively, the light reflectance in each of the front surface and the back surface of the substrate 110 may be reduced. Further, because both a light incident operation and a light reflection operation may be performed on each of the first and second textured surfaces 111 and 113 of the substrate 110, light may be confined in the solar cell. Hence, light absorption may increase, and the efficiency of the solar cell may be improved. In addition, because a reflection loss of the light incident on the substrate 110 may be reduced by the first anti-reflection layer 130 and/or the second anti-reflection layer 160, an amount of light incident on the substrate 110 may further increase.

The electron-hole pairs are separated into electrons and holes by the p-n junction between the substrate 110 and the emitter layer 120, and the separated holes move to the p-type emitter layer 120 and the separated electrons move to the n-type substrate 110. The holes moving to the emitter layer 120 move to the first electrodes 140, and the electrons moving to the substrate 110 move to the second electrodes 170 through the back surface field layer 150. Accordingly, when the first electrodes 140 of one solar cell are connected to the second electrodes 170 of another solar cell adjacent to the one solar cell using electric wires (not shown) such as interconnectors, electric current flows through the solar cells and allows use of the electric current for electric power.

The solar cell having the above-described configuration may be used in a state where the solar cell is positioned between a light transmission front substrate and a light transmission back substrate and is sealed by a protective layer.

An exemplary method for manufacturing the solar cell having the above-described configuration is described below with reference to FIGS. 3 to 9.

A substrate formed of a silicon wafer may be manufactured by slicing a silicon block or an ingot using a blade or a multi-wire saw.

Figure 3:
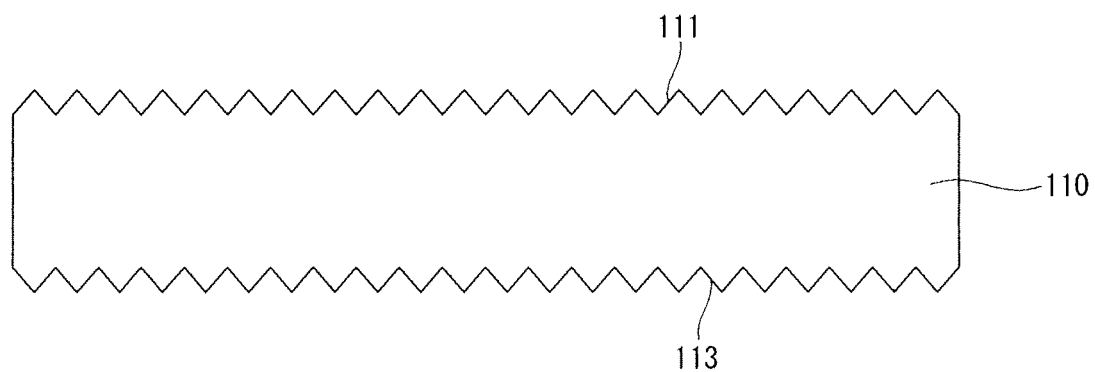
FIGS. 3 to 9 are cross-sectional views illustrating an exemplary method for manufacturing the solar cell shown in FIG. 1.

More specifically, as shown in FIG. 3, a silicon wafer may be provided and then doped with impurities of a group V element, for example, phosphorus (P) to form a substrate 110 having resistivity of about 1 $\Omega \cdot cm^2$ to about 10 $\Omega \cdot cm^2$.

When the silicon block or the ingot is sliced, a mechanical damage layer may be formed in the silicon wafer. Thus, a wet etching process for removing the mechanical damage layer may be performed, so as to prevent a reduction in characteristics of the solar cell resulting from the mechanical damage layer. An alkaline etchant or an acid etchant may be used in the wet etching process.

After the mechanical damage layer is removed, the wet etching process or a dry plasma etching process may be performed to form a first textured surface 111 in the front surface of the substrate 110 and a second textured surface 113 in the back surface of the substrate 110.

Figure 4:
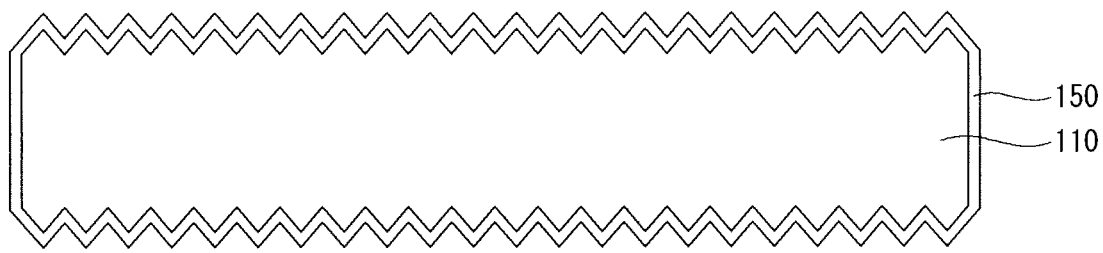

As shown in FIG. 4, after the first and second textured surfaces 111 and 113 are formed, a back surface field layer 150 may be formed at each of the front surface, the back surface, and the side surface of the substrate 110 by doping each of the front surface, the back surface, and the side surface of the substrate 110 with impurities of a group V element.

Figure 5:
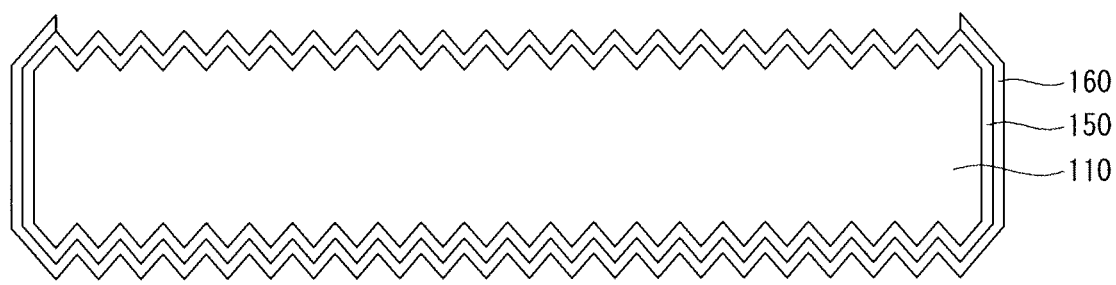

As shown in FIG. 5, a second anti-reflection layer 160 formed of silicon nitride (SiNx:H) may be formed at the entire back surface, the entire side surface, and an edge of the front surface of the substrate 110. The second anti-reflection layer 160 may be formed by depositing silicon nitride using a plasma enhanced chemical vapor deposition (PECVD) method, a sputtering method, or other methods. The second anti-reflection layer 160 may have a refractive index of about 1.9 to about 2.3 and a thickness of about 50 nm to about 300 nm.

Figure 6:

Subsequently, as shown in FIG. 6, an etched back process using the second anti-reflection layer 160 as a mask may be performed on the front surface of the substrate 110 to remove the back surface field layer 150 formed at the front surface of the substrate 110.

More specifically, the etched back process may be performed so that an end of the back surface field layer 150 protrudes less than an end of the second anti-reflection layer 160. Hence, electrical insulation between the back surface field layer 150 and an emitter layer 120 may be implemented.

Figure 7:
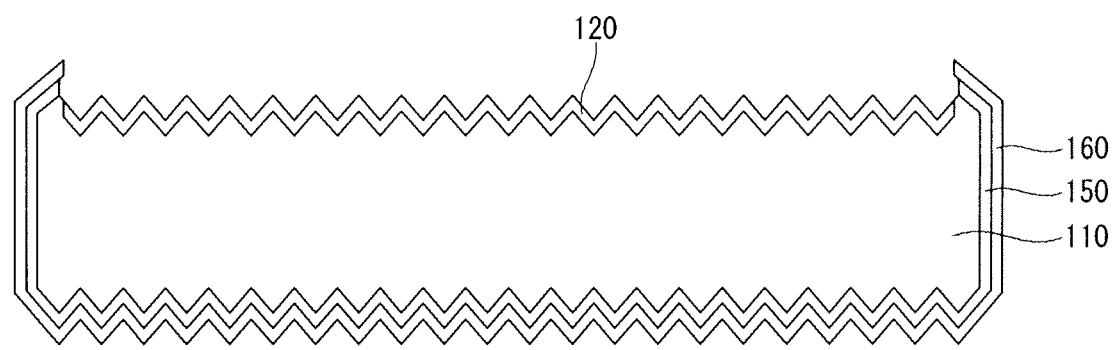

As shown in FIG. 7, after the etched back process is performed, the emitter layer 120 may be formed at the front surface of the substrate 110 by doping the front surface of the substrate 110 with impurities of a group III element.

In this case, the second anti-reflection layer 160 is positioned at the edge of the front surface of the substrate 110, and the second anti-reflection layer 160 may serve as an impurity diffusion barrier layer during formation of the emitter layer 120. Further, the emitter layer 120 may be formed at the first textured surface 111 which is not covered by the second anti-reflection layer 160 and thus may be electrically insulated from the back surface field layer 150.

Subsequently, a natural oxide layer may be removed by etching the substrate 110 using hydrofluoric acid (HF), and the first anti-reflection layer 130 may be formed on the emitter layer 120.

Figure 8:
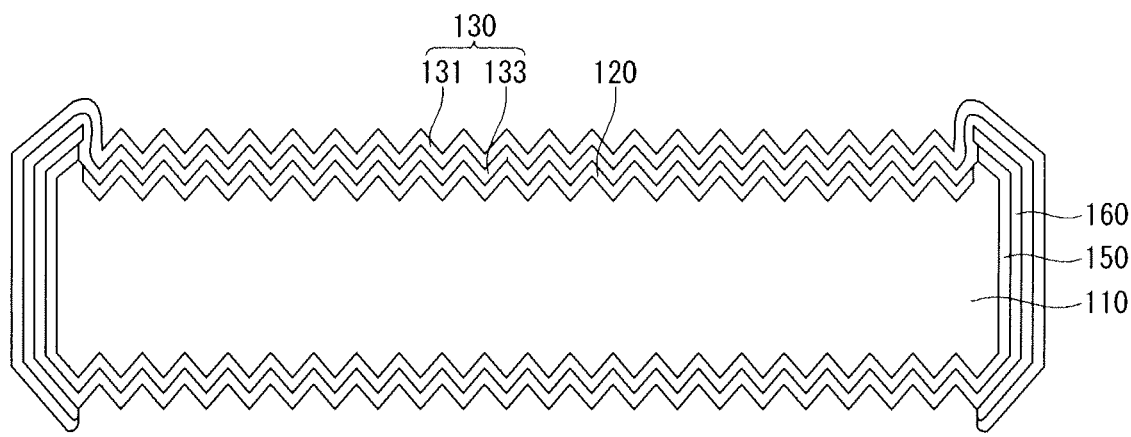

As shown in FIG. 8, the first anti-reflection layer 130 may be formed by sequentially stacking the lower layer 133 and the lower layer 131.

The lower layer 133 may serve as a passivation layer as well as an anti-reflection layer. The lower layer 133 may be formed by depositing aluminum oxide using the PECVD method, the sputtering method, or other methods. The lower layer 133 may have a refractive index of about 1.55 to about 1.7 and a thickness equal to or less than about 50 nm. Alternatively, the lower layer 133 may be formed using thermal oxide.

The upper layer 131 may be formed by deposing silicon nitride using the PECVD method, the sputtering method, or other methods. The upper layer 131 may have a refractive index of about 1.9 to about 2.3 and a thickness of about 50 nm to about 100 nm.

As shown in FIG. 8, the first anti-reflection layer 130 may extend to the edge of the back surface of the substrate 110. Alternatively, the first anti-reflection layer 130 may be formed only on the emitter layer 120 or may extend to the edge of the front surface of the substrate 110.

According to the above-described manufacturing method, the back surface field layer 150, the second anti-reflection layer 160, and the first anti-reflection layer 130 may be positioned at the edge of the front surface of the substrate 110, the side surface of the substrate 110, and the edge of the back surface of the substrate 110.

Figure 9:
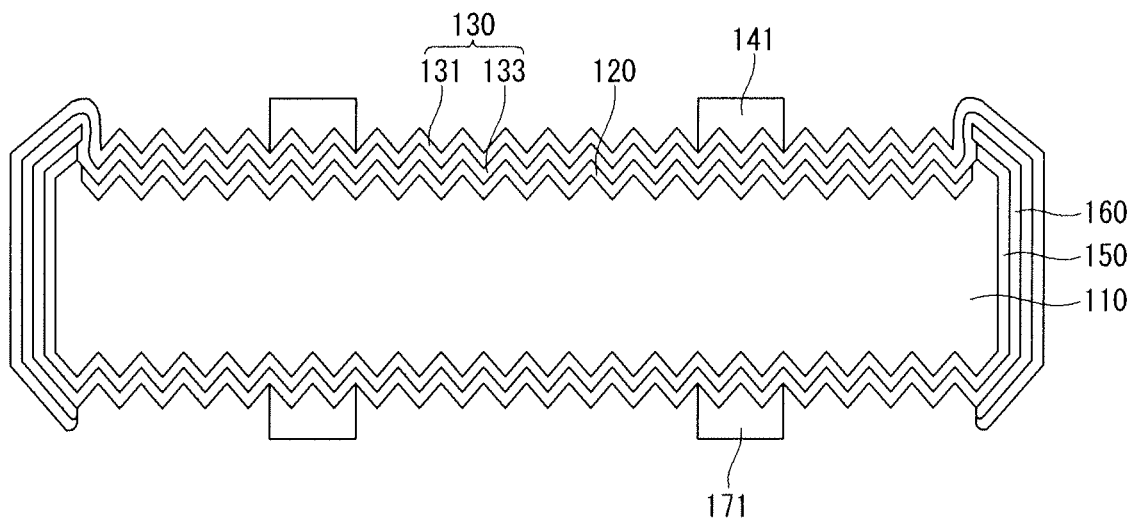

Next, as shown in FIG. 9, a first conductive paste 141 may be printed on the front surface of the substrate 110 with a first electrode pattern, and a second conductive paste 171 may be printed on the back surface of the substrate 110 with a second electrode pattern. The first conductive paste 141 and the second conductive paste 171 may be fired.

The first conductive paste 141 may be a conductive material obtained by mixing a mixture (AgAl) of silver (Ag) and aluminum (Al) with a glass fit, and the second conductive paste 171 may be a conductive material obtained by mixing silver (Ag) with the glass fit. Alternatively, the conductive material contained in each of the first conductive paste 141 and the second conductive paste 171 may be at least one material selected from the group consisting of nickel (Ni), copper (Cu), tin (Sn), zinc (Zn), indium (In), titanium (Ti), gold (Au), and a combination thereof, other than the above materials.

When the first conductive paste 141 and the second conductive paste 171 are fired, a punch through operation is generated because of lead (Pb) contained in the glass frit. Thus, first electrodes 140 electrically and physically connected to the emitter layer 120 may be formed, and second electrodes 170 electrically and physically connected to the back surface field layer 150 may be formed.

Although it is not shown, the first electrodes 140 and the second electrodes 170 may be formed using a plating layer. In this case, a contact line may be formed on each of the first anti-reflection layer 130 and the second anti-reflection layer 160, and the plating layer may be formed on each of the emitter layer 120 and the back surface field layer 150 exposed through the contact lines. Hence, the first electrodes 140 and the second electrodes 170 may be formed.

The plating layer may include a metal seed layer formed of nickel silicide (for example, $Ni_2Si$, $NiSi$, and $NiSi_2$), a nickel diffusion barrier layer, a copper layer, and a tin layer. Other layered or non-layered structures may be used for the plating layer.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:
    a substrate doped with impurities having a first conductive type and a first doping concentration, the substrate having a front textured surface, a back textured surface, and side surfaces;
    a back surface field layer doped with impurities having the first conductive type and a second doping concentration higher than the first doping concentration;
    an emitter layer doped with impurities having a second conductive type opposite the first conductive type, the emitter layer diffused in the front textured surface of the substrate;
    the substrate including a separation region formed between the emitter layer and the back surface field layer,
    the emitter layer selectively formed only inwardly spaced a predetermined distance from edges of the front textured surface of the substrate to form edge regions between the emitter layer and an edge of the front textured surface of the substrate,
    the back surface field layer formed on the back textured surface, the side surfaces, and the edge regions of the front textured surface including a portion of the edge regions so as not to overlap with the emitter layer, thereby the separation region formed in the edge regions of the front textured surface of the substrate;
    a front anti-reflection layer on the emitter layer;
    a plurality of first electrodes electrically connected to the emitter layer through a plurality of through holes formed at the front anti-reflection layer;
    a back anti-reflection layer on the back surface field layer including at the back surface field layer on the portion of the edge regions; and
    a plurality of second electrodes electrically connected to the back surface field layer through a plurality of through holes formed at the back anti-reflection layer,
    wherein the front anti-reflection layer includes a first portion and a second portion on the edge regions,
    wherein the first portion of the anti-reflection layer abuts the back surface field layer and the back anti-reflection layer on the portion of the edge regions, and
    wherein the first portion and the second portion of the front antireflection layer are formed continuously to cover the back surface field layer and the back anti-reflection layer on the portion of the edge regions and a remaining portion of the edge regions.

2. The solar cell of claim 1, wherein the back anti-reflection layer extends a distance over the edge regions of the front textured surface of the substrate of equal to or less than 1 mm.

3. The solar cell of claim 2, wherein the back anti-reflection layer extends a distance over the edge regions of the front textured surface of the substrate at least as much as a distance the back surface field layer extends over the edge regions of the front textured surface of the substrate.

4. The solar cell of claim 3, wherein the edge regions of the front textured surface of the substrate is not covered by the emitter layer.

5. The solar cell of claim 4, wherein the distance the back surface field layer extends over the edge regions of the front textured surface of the substrate is less than a width of the edge regions of the front textured surface of the substrate that is not covered by the emitter layer.

6. The solar cell of claim 5, wherein the distance the back anti-reflection layer extends over the edge regions of the front textured surface of the substrate is equal to the width of the edge regions of the front textured surface of the substrate that is not covered by the emitter layer.

7. The solar cell of claim 1, wherein the front anti-reflection layer extends a distance over the edge regions of the back textured surface of the substrate of equal to or less than 1 mm.

8. The solar cell of claim 1, wherein the front textured surface and the back textured surface of the substrate have a plurality of uneven portions.

9. The solar cell of claim 1, wherein the front anti-reflection layer includes:
    an upper layer; and
    a lower layer between the emitter layer and the upper layer.

10. The solar cell of claim 9, wherein the lower layer includes an aluminum oxide layer or a thermal oxide layer, and wherein the upper layer includes a silicon nitride layer.

11. The solar cell of claim 9, wherein the back anti-reflection layer includes a silicon nitride layer, and
    wherein the back anti-reflection layer and the upper and lower layers of the front anti-reflection layer overlap each other at the edge regions of the front textured surface of the substrate.

12. The solar cell of claim 1, wherein the back anti-reflection layer fully covers an outside surface of the back surface field layer on the back textured surface, the side surfaces and edge regions of the front textured surface of the substrate.

13. The solar cell of claim 1, wherein the front anti-reflection layer fully covers an outside surface of the emitter layer.

* * * * *